US011626298B2

(12) United States Patent
Takamatsu et al.

(10) Patent No.: US 11,626,298 B2
(45) Date of Patent: Apr. 11, 2023

(54) LIQUID SUPPLY DEVICE AND LIQUID SUPPLY METHOD

(71) Applicant: TOKYO ELECTRON LIMITED, Tokyo (JP)

(72) Inventors: Yusuke Takamatsu, Koshi (JP); Yasuhiro Takaki, Koshi (JP); Shinichi Umeno, Koshi (JP); Shogo Fukui, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 255 days.

(21) Appl. No.: 16/603,044

(22) PCT Filed: Mar. 23, 2018

(86) PCT No.: PCT/JP2018/011742
§ 371 (c)(1),
(2) Date: Oct. 4, 2019

(87) PCT Pub. No.: WO2018/186211
PCT Pub. Date: Oct. 11, 2018

(65) Prior Publication Data
US 2021/0111043 A1    Apr. 15, 2021

(30) Foreign Application Priority Data

Apr. 6, 2017  (JP) .............................. JP2017-076297
Feb. 22, 2018  (JP) .............................. JP2018-029284

(51) Int. Cl.
*H01L 21/67*     (2006.01)
*B08B 3/08*      (2006.01)
(Continued)

(52) U.S. Cl.
CPC .... *H01L 21/67051* (2013.01); *B01D 19/0042* (2013.01); *B01D 19/02* (2013.01);
(Continued)

(58) Field of Classification Search
CPC ......... H01L 21/67051; H01L 21/68764; H01L 21/67028; H01L 21/67017; H01L 21/027;
(Continued)

(56) References Cited

U.S. PATENT DOCUMENTS

| 2003/0180471 A1* | 9/2003 | Takekuma | .......... H01L 21/6715 430/271.1 |
| 2008/0178910 A1* | 7/2008 | Hiroshiro | .......... H01L 21/67051 134/19 |
| 2011/0008964 A1* | 1/2011 | Hughes | ............... H01L 21/3212 438/692 |
| 2011/0056913 A1* | 3/2011 | Mayer | ....................... C23F 1/46 216/84 |

(Continued)

FOREIGN PATENT DOCUMENTS

| JP | 2013-207207 A | 10/2013 |
| TW | 201632312 A | 9/2016 |

*Primary Examiner* — Alexander Markoff
(74) *Attorney, Agent, or Firm* — Nath, Goldberg & Meyer; Jerald L. Meyer; Tanya E. Harkins

(57) ABSTRACT

A liquid supply device includes: a storage tank configured to store a processing liquid including a first processing liquid (sulfuric acid) and a second processing liquid (hydrogen peroxide solution); a circulation path having a first pipeline through which the processing liquid passes in a horizontal direction, and configured to circulate the processing liquid stored in the storage tank; a branch path configured to supply the processing liquid to a processing unit; and a branching part having an opening for allowing the processing liquid to flow out from the first pipeline to the branch path, wherein the opening is formed in the branching part and formed below a periphery of the first pipeline when the first pipeline is viewed in section.

17 Claims, 10 Drawing Sheets

(51) Int. Cl.
  *B01D 19/00*  (2006.01)
  *B01D 19/02*  (2006.01)
  *B01D 29/52*  (2006.01)
  *B05C 5/02*  (2006.01)
  *B05C 11/10*  (2006.01)
  *H01L 21/687*  (2006.01)

(52) U.S. Cl.
  CPC ............... *B01D 29/52* (2013.01); *B05C 5/02* (2013.01); *B05C 11/10* (2013.01); *B08B 3/08* (2013.01); *H01L 21/68764* (2013.01)

(58) Field of Classification Search
  CPC ............ H01L 21/304; H01L 21/02307; H01L 21/02052; H01L 21/6715; H01L 21/67098; H01L 21/67259; H01L 21/67766; B01D 19/0042; B01D 19/02; B01D 29/52; B01D 29/03; B01D 19/00; B05C 5/02; B05C 11/10; B08B 3/08; B01J 4/00
  See application file for complete search history.

(56) References Cited

U.S. PATENT DOCUMENTS

| | | | |
|---|---|---|---|
| 2013/0152605 A1* | 6/2013 | Mimata | H01L 21/67109 62/3.3 |
| 2013/0220478 A1* | 8/2013 | Kasahara | H01L 21/67017 141/2 |
| 2015/0020968 A1* | 1/2015 | Kimura | H01L 21/67057 156/345.18 |
| 2015/0092167 A1* | 4/2015 | Terashita | H01L 21/67017 355/30 |
| 2015/0125793 A1* | 5/2015 | Yoshihara | H01L 21/67017 430/270.1 |
| 2016/0233082 A1* | 8/2016 | Yano | H01L 21/67051 |
| 2016/0305688 A1* | 10/2016 | Nakayama | F24H 1/142 |
| 2016/0305699 A1* | 10/2016 | Boarman | F25B 21/02 |
| 2017/0229324 A1* | 8/2017 | Nakashima | H01L 21/6708 |
| 2017/0345662 A1* | 11/2017 | Sasaki | B24B 37/04 |
| 2018/0236510 A1* | 8/2018 | Osada | H01L 21/67253 |
| 2019/0371628 A1* | 12/2019 | Yasuda | H01L 21/67023 |
| 2021/0111043 A1* | 4/2021 | Takamatsu | B08B 3/08 |

* cited by examiner

LIQUID SUPPLY DEVICE AND LIQUID SUPPLY METHOD

This is a National Phase Application under 35 U.S.C. 371 as a national stage of PCT/JP2018/011742, filed Mar. 23, 2018, an application claiming the benefit of priority from Japanese Patent Application No. 2017-076297, filed on Apr. 6, 2017, and Japanese Patent Application No. 2018-029284, filed on Feb. 22, 2018, the entire contents of which are incorporated herein by reference.

TECHNICAL FIELD

The present disclosure relates to a technique for supplying a processing liquid to a substrate processing apparatus.

BACKGROUND

A substrate processing apparatus that processes a substrate such as a semiconductor wafer or a glass substrate using a liquid mixture obtained by mixing a first processing liquid and a second processing liquid stored in tanks and supplied from the tanks is known in the related art.

In this type of substrate processing apparatus, in some cases, the first processing liquid may be recovered and reused by returning the used liquid mixture to the tank that stores the first processing liquid. The first processing liquid recovered in the tank is mixed with the second processing liquid again through a circulation path and supplied to the substrate (see Patent Document 1).

PRIOR ART DOCUMENTS

Patent Documents

Patent Document 1: Japanese laid-open publication No. 2013-207207

However, by returning the used liquid mixture, not only the first processing liquid but also the second processing liquid is contained in the tank. A mixture of the first processing liquid and the second processing liquid may be foamed due to reaction of the two liquids, the influence of heat, or the like. In order to improve the performance of substrate processing, it is preferable to supply a processing liquid that does not include foams.

The present disclosure provides some embodiments of a liquid supply device and a liquid supply method capable of preventing foams from being included in a processing liquid supplied to a substrate processing apparatus.

SUMMARY

A liquid supply device according to one aspect of embodiment is a liquid supply device for supplying a processing liquid to a substrate processing apparatus. The liquid supply device includes: a storage configured to store a processing liquid including a first processing liquid and a second processing liquid; a circulation path having a first pipeline through which the processing liquid passes in a horizontal direction, and configured to circulate the processing liquid stored in the storage; a branch path configured to supply the processing liquid to the substrate processing apparatus; and a branching part having an opening for allowing the processing liquid to flow out from the first pipeline to the branch path. The opening is formed in the branching part and formed below a periphery of the first pipeline when the first pipeline is viewed in section.

According to one aspect of the embodiment, it is possible to achieve an effect of preventing foams from being included in a processing liquid supplied to a substrate processing apparatus.

DETAILED DESCRIPTION

Embodiments of a liquid supply device and a liquid supply method disclosed in the present disclosure will now be described in detail with reference to the accompanying drawings. It is noted that the present disclosure is not limited by embodiments described below.

First Embodiment

Figure 1:
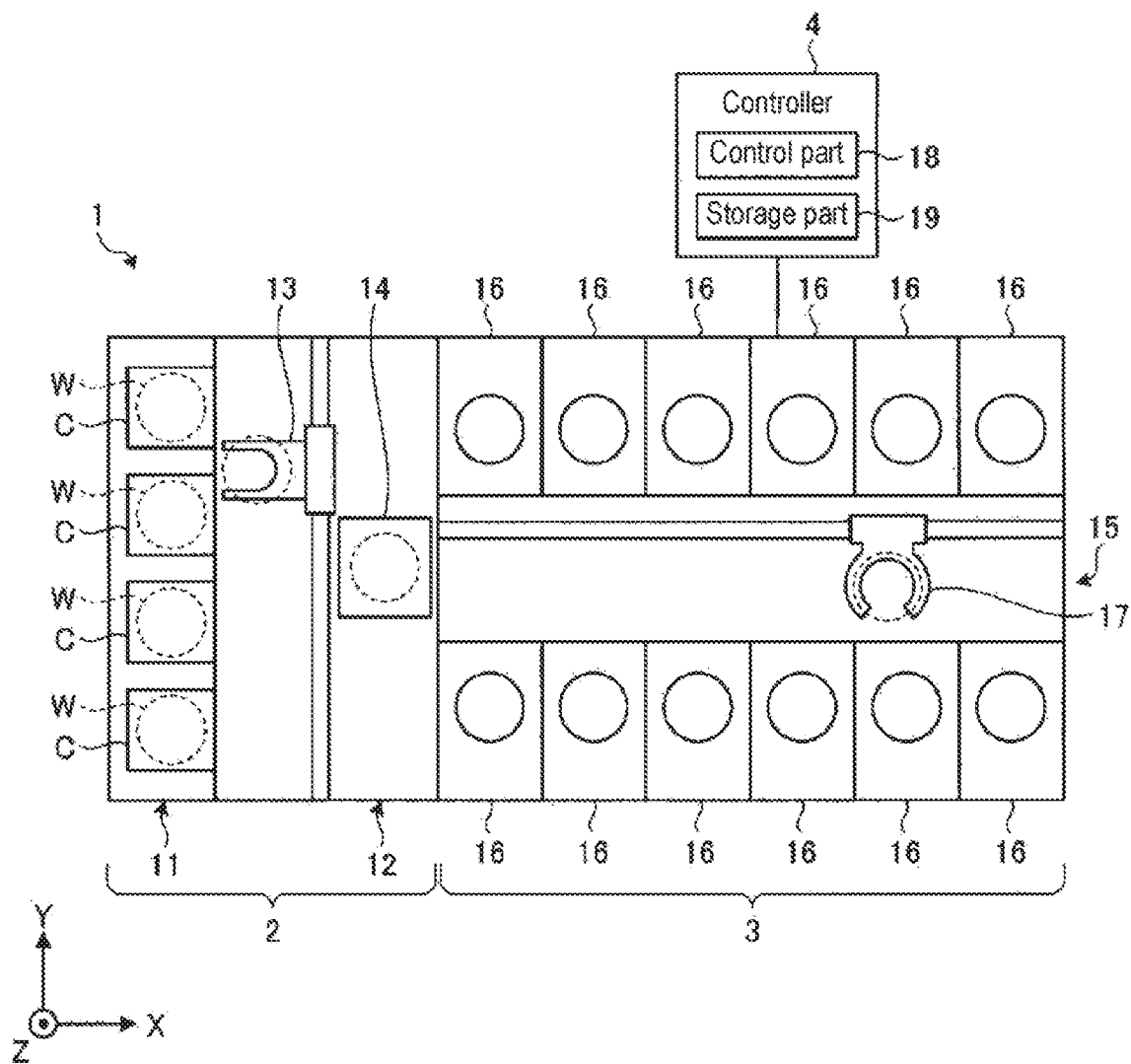
FIG. 1 is a view illustrating a schematic configuration of a substrate processing system according to a first embodiment of the present disclosure.

FIG. 1 is a view illustrating a schematic configuration of a substrate processing system according to a first embodiment. In the following, in order to clarify the positional relationship, an X axis, a Y axis, and a Z axis that are orthogonal to one another are defined, and it is assumed that the positive direction of the Z axis is an upward vertical direction.

As illustrated in FIG. 1, the substrate processing system 1 includes a loading/unloading station 2 and a processing station 3. The loading/unloading station 2 and the processing station 3 are arranged adjacent to each other.

The loading/unloading station 2 includes a carrier stage 11 and a transfer part 12. A plurality of carriers C in which a plurality of wafers W (substrates) is accommodated in a horizontal position is mounted on the carrier stage 11.

The transfer part 12 is disposed adjacent to the carrier stage 11 and includes a substrate transfer device 13 and a delivery part 14 therein. The substrate transfer device 13 includes a substrate holding mechanism that holds the wafers W. Further, the substrate transfer device 13 can move in a horizontal direction and the vertical direction and rotate around the vertical axis. The substrate transfer device 13 transfers the wafers W between the carriers C and the delivery part 14 by using the substrate holding mechanism.

The processing station 3 is disposed adjacent to the transfer part 12. The processing station 3 includes a transfer part 15 and a plurality of processing units 16. The processing units 16 are arranged side by side in both sides of the transfer part 15.

The transfer part 15 includes a substrate transfer device 17 therein. The substrate transfer device 17 includes a substrate holding mechanism that holds the wafers W. Further, the substrate transfer device 17 can move in the horizontal direction and the vertical direction, and can rotate around the vertical axis. The substrate transfer device 17 transfers the wafers W between the delivery part 14 and the processing unit 16 by using the substrate holding mechanism.

The processing unit 16 performs predetermined substrate processes on the wafers W transferred by the substrate transfer device 17.

The substrate processing system 1 further includes a controller 4. The controller 4 is, for example, a computer and includes a control part 18 and a storage part 19. The storage part 19 stores a program for controlling various processes executed in the substrate processing system 1. The control part 18 controls the operation of the substrate processing system 1 by reading and executing the program stored in the storage part 19.

Such a program may be recorded on a computer-readable storage medium and may be installed in the storage part 19 of the controller 4 from the storage medium. Examples of the computer-readable storage medium may include a hard disk (HD), a flexible disk (FD), a compact disk (CD), a magnetic optical disk (MO), a memory card, and the like.

In the substrate processing system 1 configured as described above, first, the substrate transfer device 13 of the loading/unloading station 2 takes out a wafer W from the carrier C mounted on the carrier stage 11 and places the taken-out wafer W on the delivery part 14. The wafer W placed on the delivery part 14 is taken out from the delivery part 14 by the substrate transfer device 17 of the processing station 3 and is loaded into the processing unit 16.

The wafer W loaded into the processing unit 16 is processed by the processing unit 16. Then, the wafer W is unloaded from the processing unit 16 by the substrate transfer device 17, and placed on the delivery part 14. Then, the processed wafer W placed on the delivery part 14 is returned to the carrier C of the carrier stage 11 by the substrate transfer device 13.

Figure 2:
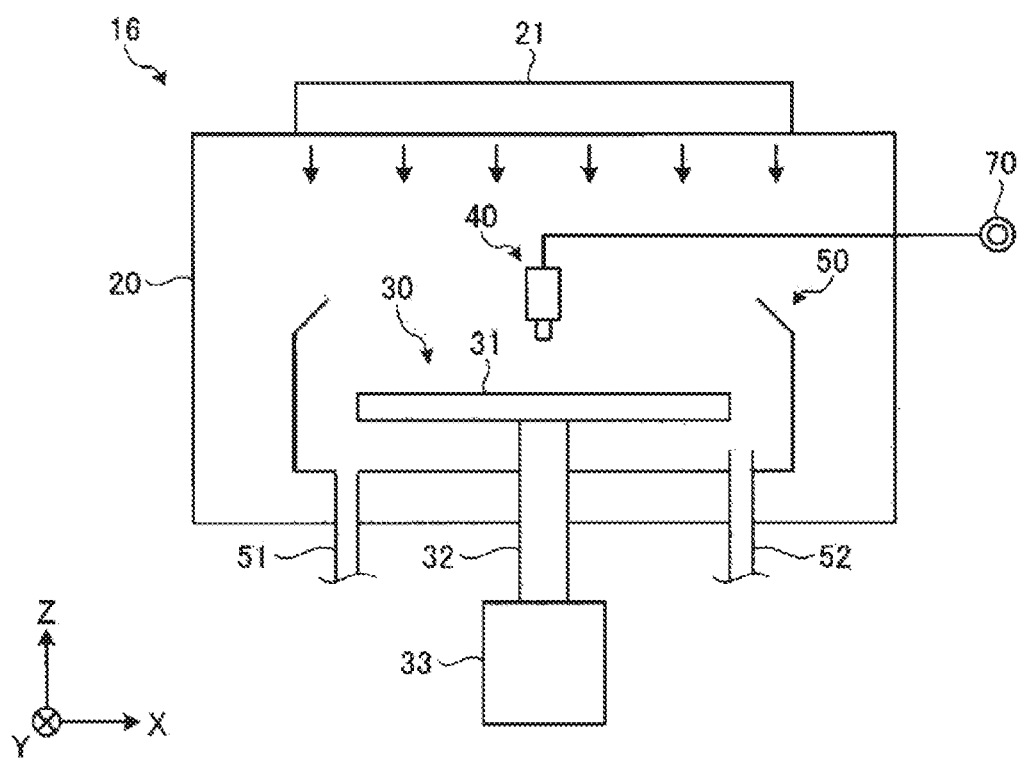
FIG. 2 is a view illustrating a schematic configuration of a processing unit.

Next, a schematic configuration of the processing unit 16 will be described with reference to FIG. 2. FIG. 2 is a view illustrating a schematic configuration of the processing unit 16.

As illustrated in FIG. 2, the processing unit 16 includes a chamber 20, a substrate holding mechanism 30, a processing fluid supply 40, and a recovery cup 50.

The chamber 20 accommodates the substrate holding mechanism 30, the processing fluid supply 40, and the recovery cup 50. A fan filter unit (FFU) 21 is installed on the ceiling of the chamber 20. The FFU 21 forms a down flow in the chamber 20.

The substrate holding mechanism 30 includes a holder 31, a support pillar 32, and a driver 33. The holder 31 holds the wafer W in a horizontal position. The support pillar 32 extends in the vertical direction, and has proximal end rotatably supported by the driver 33 and a distal end supporting the holder 31 in a horizontal position. The driver 33 rotates the support pillar 32 around a vertical axis. The substrate holding mechanism 30 rotates the holder 31 by rotating the support pillar 32 using the driver 33, thereby rotating the wafer W held by the holder 31.

The processing fluid supply 40 supplies a processing fluid to the wafer W. The processing fluid supply 40 is connected to a processing fluid supply source 70.

The recovery cup 50 is arranged so as to surround the holder 31 and collects a processing liquid scattered from the wafer W by the rotation of the holder 31. A liquid drain port 51 is formed at the bottom of the recovery cup 50, and the processing liquid collected by the recovery cup 50 is discharged from the liquid drain port 51 to the outside of the processing unit 16. Further, an exhaust port 52 for discharging a gas supplied from the FFU 21 to the outside of the processing unit 16 is formed at the bottom of the recovery cup 50.

Figure 3:
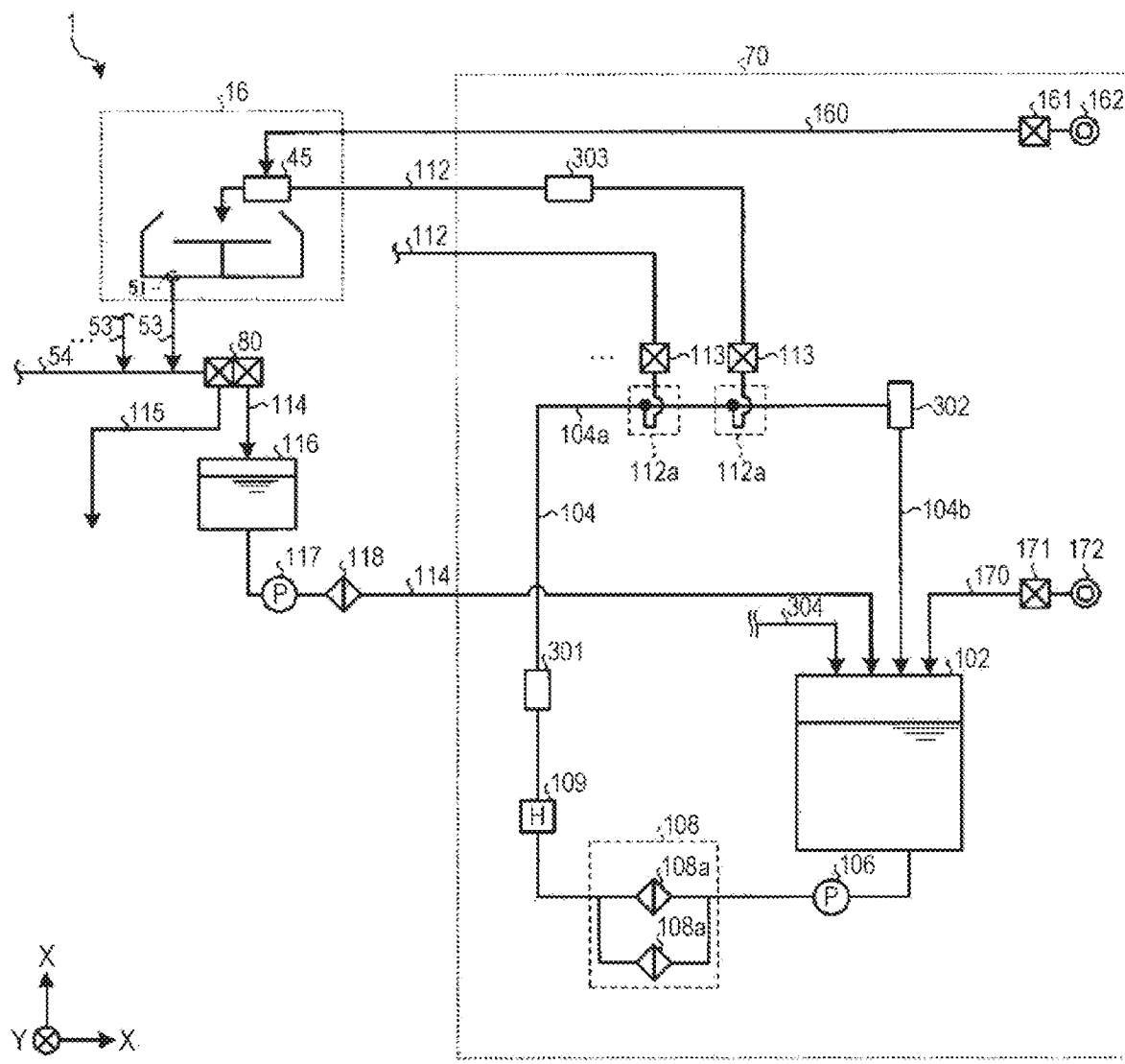
FIG. 3 is a view illustrating a specific configuration example of a processing liquid supply system in the substrate processing system according to the first embodiment of the present disclosure.

Next, a specific configuration of a processing liquid supply system in the substrate processing system 1 according to the embodiment will be described with reference to FIG. 3. FIG. 3 is a view illustrating a specific configuration of a processing liquid supply system in the substrate processing system 1 according to the embodiment.

The following description will be given with a configuration of the processing liquid supply system in a case where sulfuric acid is used as a first processing liquid, hydrogen peroxide solution is used as a second processing liquid, and a sulfuric acid hydrogen peroxide mixture (SPM), which is a mixture of the first and second liquids, is supplied to the wafer W.

As illustrated in FIG. 3, the processing fluid supply source 70 includes a sulfuric acid supply system including a storage tank 102 that stores sulfuric acid, a circulation path 104 that exits from the storage tank 102 and returns to the storage tank 102, and a plurality of branch paths 112 that branch from the circulation path 104 and is connected to the respective processing units 16 (substrate processing apparatus).

The processing liquid supply system of the first embodiment is to recover and reuse the SPM supplied to the wafer W, as will be described later. To this end, not only sulfuric acid but also hydrogen peroxide solution is stored in and passed through the sulfuric acid supply system. Therefore, in the first embodiment, a liquid stored in and passed through the sulfuric acid supply system is defined as a processing liquid containing sulfuric acid (the first processing liquid) and hydrogen peroxide solution (the second processing liquid), which will be described below.

In the circulation path 104, a pump 106, a filter part 108, a heater 109, a defoamer 301, and a gas discharger 302 are arranged in this order from the upstream side. The pump 106 forms a circulation flow that exits from the storage tank 102, passes through the circulation path 104, and returns to the storage tank 102. The filter part 108 removes unnecessary substances such as particles contained in sulfuric acid. The heater 109 is controlled by the control part 18 to heat the sulfuric acid circulating through the circulation path 104 to a set temperature.

The circulation path 104 includes a first pipeline 104a through which the processing liquid passes in the horizontal direction (positive direction of the X axis), and a second pipeline 104b, which is located in the downstream of the first pipeline 104a and through which the processing liquid passes in the downward direction (negative direction of the Z axis). Details of the defoamer 301 and the gas discharger 302 will be described later.

The plurality of branch paths 112 are connected to the first pipeline 104a in the circulation path 104. The branch paths 112 are respectively connected to a mixer 45 (which will be described later) of the respective processing units 16 and supply sulfuric acid flowing through the circulation path 104 to the respective mixer 45. Each branch path 112 is provided with a valve 113. Each branch path 112 is also provided with a flow meter 303 for measuring the flow rate of the processing liquid flowing through the pipeline. Each branch path 112 is branched at a branching part 112a from the circulation path 104. Details of the branching part 112a will be described later.

The processing fluid supply source 70 further includes a hydrogen peroxide solution supply system including a hydrogen peroxide solution supply path 160, a valve 161, and a hydrogen peroxide solution supply source 162. One end of the hydrogen peroxide solution supply path 160 is connected to the hydrogen peroxide solution supply source 162 via the valve 161, and the other end thereof is connected to the mixer 45 (which will be described later) of the processing unit 16. The processing fluid supply source 70 supplies hydrogen peroxide solution, which is supplied from the hydrogen peroxide solution supply source 162, to the mixer 45 of the processing unit 16 via the hydrogen peroxide solution supply path 160.

The processing fluid supply source 70 further includes a supply path 170, a valve 171, and a sulfuric acid supply source 172. One end of the supply path 170 is connected to the sulfuric acid supply source 172 via the valve 171, and the other end thereof is connected to the storage tank 102. The sulfuric acid supply source 172 supplies sulfuric acid. The processing fluid supply source 70 supplies sulfuric acid, which is supplied from the sulfuric acid supply source 172, to the storage tank 102 via the supply path 170. The storage tank 102 is provided with a liquid level sensor (not shown). When it is detected by the liquid level sensor that the liquid level of the storage tank 102 has reached a lower limit value, a predetermined amount of sulfuric acid is replenished into the storage tank 102 via the supply path 170. As a result, the concentration and amount of liquid in the storage tank 102 are kept constant.

Although not shown, the processing fluid supply source 70 further includes a rinse liquid supply path for supplying a rinse liquid to the processing unit 16. For example, de-ionized wafer (DIW) may be used as the rinse liquid.

The processing unit 16 includes the mixer 45. The mixer 45 mixes the sulfuric acid supplied from the branch path 112 and the hydrogen peroxide solution supplied from the hydrogen peroxide solution supply path 160 to generate an SPM which is a liquid mixture, and supplies the generated SPM to the processing fluid supply 40 (see FIG. 2). The mixer 45 may be integrated into the processing fluid supply 40.

The liquid drain port 51 of each processing unit 16 is connected to a discharge path 54 via a branch path 53. The SPM used in each processing unit 16 is discharged from the liquid drain port 51 to the discharge path 54 via the branch path 53.

Here, the supply of the SPM and the supply of the rinse liquid are performed using the processing fluid supply 40. However, the processing unit 16 may include a separate processing fluid supply for supplying the rinse liquid.

The substrate processing system 1 further includes a switch 80, a recovery path 114, and a discard path 115. The switch 80 is connected to the discharge path 54, the recovery path 114, and the discard path 115 and switches an inflow destination of the used SPM flowing through the discharge path 54 between the recovery path 114 and the discard path 115 according to control of the control part 18.

The recovery path 114 has one end connected to the switch 80 and the other end connected to the storage tank 102. In the recovery path 114, a recovery tank 116, a pump 117, and a filter 118 are arranged in this order from the upstream side. The recovery tank 116 temporarily stores the used SPM. The pump 117 forms a flow of the used SPM stored in the recovery tank 116 to the storage tank 102. The filter 118 removes contaminants such as particles contained in the used SPM.

The discard path 115 is connected to the switch 80 and discharges the used SPM, which inflows from the discharge path 54 via the switch 80, to the outside of the substrate processing system 1.

Figure 4:
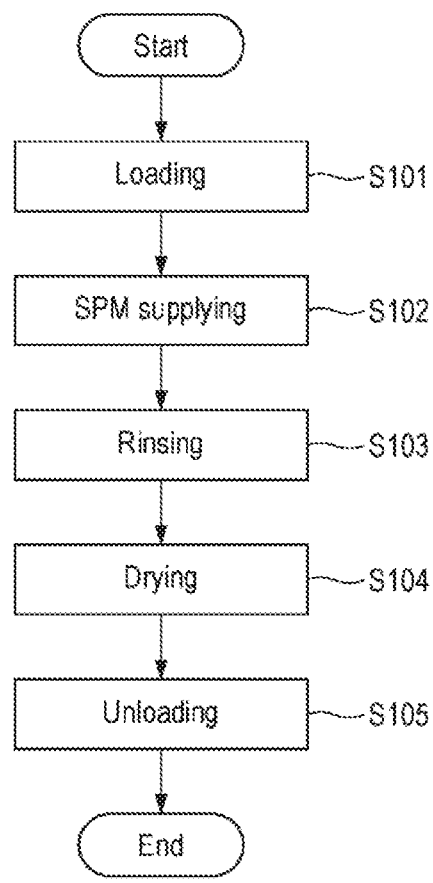
FIG. 4 is a flowchart illustrating an example of a substrate processing procedure executed by the processing unit according to the first embodiment of the present disclosure.

Next, the contents of substrate processing executed by the processing unit 16 according to the first embodiment will be described with reference to FIG. 4. FIG. 4 is a flowchart illustrating an example of a substrate processing procedure executed by the processing unit 16 according to the first embodiment. The processing procedure illustrated in FIG. 4 is executed under control of the control part 18.

First, in the processing unit 16, a wafer (W) loading process is performed (step S101). Specifically, a wafer W is loaded into the chamber 20 (see FIG. 2) of the processing unit 16 by the substrate transfer device 17 (see FIG. 1) and is held by the holder 31. Thereafter, the processing unit 16 rotates the holder 31 at a predetermined rotation speed (for example, 50 rpm).

Subsequently, in the processing unit 16, an SPM supplying process is performed (step S102). In the SPM supplying process, an SPM is supplied from the processing fluid supply 40 to the upper surface of the wafer W by opening the valve 113 and the valve 161 for a predetermined period of time (for example, 30 seconds). The SPM supplied to the wafer W is spread on the surface of the wafer W by a centrifugal force generated by the rotation of the wafer W.

In such an SPM supplying process, for example, a resist formed on the upper surface of the wafer W is removed using the strong oxidizing power of Caro's acid contained in the SPM and the reaction heat of sulfuric acid and hydrogen peroxide solution.

The flow rates of sulfuric acid and hydrogen peroxide solution are determined depending on the mixing ratio between sulfuric acid and hydrogen peroxide solution. Since the ratio of sulfuric acid in SPM is higher than that of hydrogen peroxide solution, the flow rate of sulfuric acid is set to be higher than that of hydrogen peroxide solution.

When the SPM supplying process in step S102 is completed, the processing unit 16 performs a rinsing process (step S103). In the rinsing process, a rinse liquid (for example, DIW) is supplied from the processing fluid supply 40 to the upper surface of the wafer W. The DIW supplied to the wafer W is spread on the surface of the wafer W by a centrifugal force generated by the rotation of the wafer W. As a result, the SPM remaining on the wafer W is washed away by the DIW.

Subsequently, in the processing unit 16, a drying process is performed (step S104). In the drying process, the wafer W is rotated at a predetermined rotation speed (for example, 1,000 rpm) for a predetermined period of time. As a result, the DIW remaining on the wafer W is removed and the wafer W is dried. Thereafter, the rotation of the wafer W is stopped.

Then, in the processing unit 16, an unloading process is performed (step S105). In the unloading process, the wafer W held by the holder 31 is delivered to the substrate transfer device 17. When this unloading process is completed, the substrate processing for one wafer W is completed.

Figure 5:
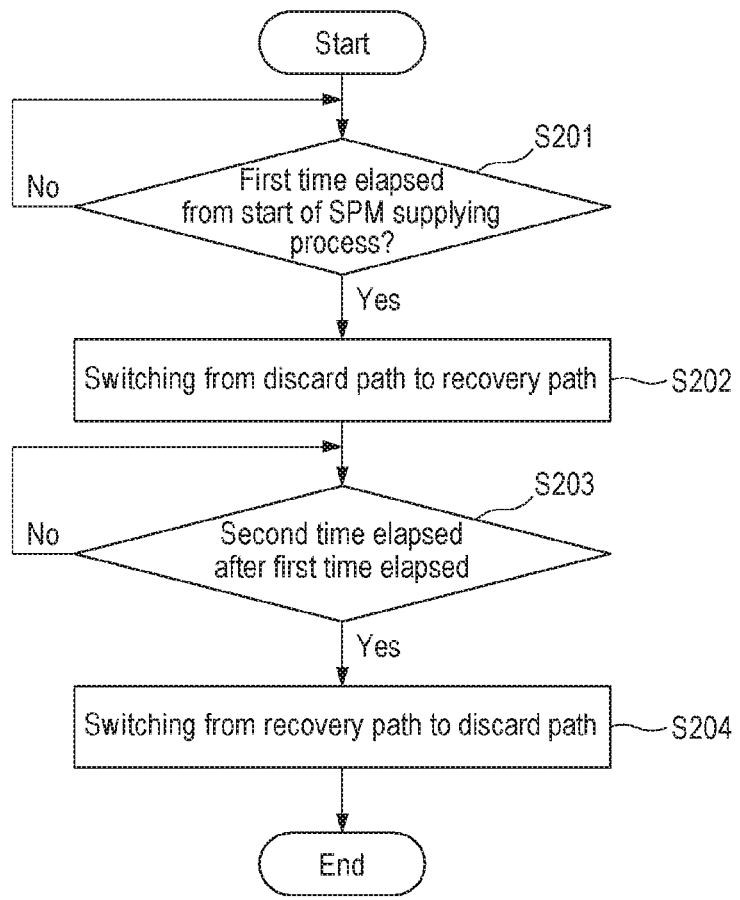
FIG. 5 is a flowchart illustrating an example of a recovery processing procedure.

Next, the contents of a used SPM recovery process will be described with reference to FIG. 5. FIG. 5 is a flowchart illustrating an example of a recovery processing procedure. FIG. 5 illustrates a recovery processing procedure when the discharge path 54 and the discard path 115 are in communication at the start of the SPM supplying process. The processing procedure illustrated in FIG. 5 is controlled by the control part 18.

As illustrated in FIG. 5, the control part 18 determines whether or not a first time has elapsed from the start of the SPM supplying process (see FIG. 4) by the processing unit 16 (step S201). Here, the first time is set to a time longer than a time from when the valves 113 and 161 are opened to when the flow rates of sulfuric acid and hydrogen peroxide solution are stabilized.

In the first embodiment, the time when both the valve 113 and the valve 161 are opened is defined as the start time of the SPM supplying process. However, the definition of the start time of the SPM supplying process is not limited thereto. The start time of the SPM supplying process may be differently defined, for example, by a time when the control part 18 sends an opening instruction signal to the valves 113 and 161, a time when the SPM reaches the wafer W and the like.

The control part 18 repeats the determining process of step S201 until the first time elapses ("No" in step S201). At this time, since the discharge path 54 communicates with the discard path 115, the used SPM is discarded from the discard path 115 to the outside.

Subsequently, when it is determined in step S201 that the first time has elapsed ("Yes" in step S201), the control part 18 controls the switch 80 to switch the inflow destination of the used SPM from the discard path 115 to the recovery path 114 (step S202). As a result, the used SPM flows from the discharge path 54 into the recovery path 114 and is returned to the storage tank 102.

Subsequently, the control part 18 determines whether or not a second time has elapsed after the first time has elapsed (step S203). The second time is set to a time when a recovery rate of the used SPM becomes a predetermined used SPM recovery rate X1. The control part 18 repeats the determining process of step S203 until the second time elapses ("No" in step S203).

Subsequently, when it is determined in step S203 that the second time has elapsed ("Yes" in step S203), the control part 18 switches the inflow destination of the used SPM from the recovery path 114 to the discard path 115 (step S204). As a result, the used SPM is discarded from the discard path 115 to the outside.

In this way, in the substrate processing system 1 according to the embodiment, the used SPM is recovered at a predetermined recovery rate except for a predetermined period after the start of the SPM supplying process and a predetermined period before the end of the SPM supplying process. As a result, the used SPM can be recovered at a stable concentration and flow rate, and the actual recovery rate of the used SPM can be matched with the predetermined recovery rate as much as possible. Therefore, according to the substrate processing system 1 according to the embodiment, it is possible to reduce consumption of sulfuric acid as much as possible.

In addition, when the discharge path 54 and the recovery path 114 are in communication with each other at the start of the SPM supplying process, the control part 18 may perform a process of switching the inflow destination of the used SPM from the recovery path 114 to the discard path 115 before the start of the SPM supplying process.

Next, a foam removing process of the first embodiment will be described. A processing liquid containing sulfuric acid (the first processing liquid) and hydrogen peroxide solution (the second processing liquid) is circulated in the circulation path 104 constituting the sulfuric acid supply system of the first embodiment. The reaction of sulfuric acid and hydrogen peroxide solution also occurs in the circulation path 104, and the processing liquid foams at that time. Further, since the inside of the circulation path 104 is kept in a relatively high temperature state, the SPM and the contained hydrogen peroxide solution are foamed over time.

If the generated foam is not removed, the processing liquid containing the foam flows from the circulation path 104 into the branch path 112 and is supplied to the wafer W through the mixer 45 of the processing unit 16. When the processing liquid containing the foam is supplied to the wafer W, discharge of the foam causes liquid scattering and mists, which affects the processing. In addition, erroneous measurement of the flow meter 303 in the branch path 112 is likely to occur. In the first embodiment, the branch path 112 is configured to perform a feedback adjustment of the flow rate based on the measurement results of the flow meter 303. In such a feedback system, if the flow meter 303 produces erroneous measurements and outputs a significantly larger flow rate, control for reducing the flow rate is executed and there is a concern that an SPM of a desired amount and mixing ratio may not be supplied to the wafer W. Further, as illustrated in the flowchart of FIG. 5 described above, in the first embodiment, the switching timing of the inflow destination of the used SPM is controlled on the premise that the SPM is accurately supplied to the wafer W according to a prescribed flow rate. Since a deviation in the feedback adjustment may occur even when the flow meter 303 produces minor erroneous measurements, the SPM is not accurately supplied to the wafer W according to the prescribed flow rate and there is a concern that the concentration of sulfuric acid in the storage tank 102 is also changed.

Since the above problems may occur, it is apparent that it is preferable to supply a processing liquid containing no foam in order to improve the performance of the SPM processing. In the first embodiment, a foam removing process using a plurality of foam removal parts is performed to prevent foams from being present in a processing liquid supplied to a substrate via a circulation path.

The plurality of foam removal parts in the first embodiment are the filter part 108, the defoamer 301, the branching part 112a, and the gas discharger 302. The details of each foam removal parts will be described below.

Figure 6:
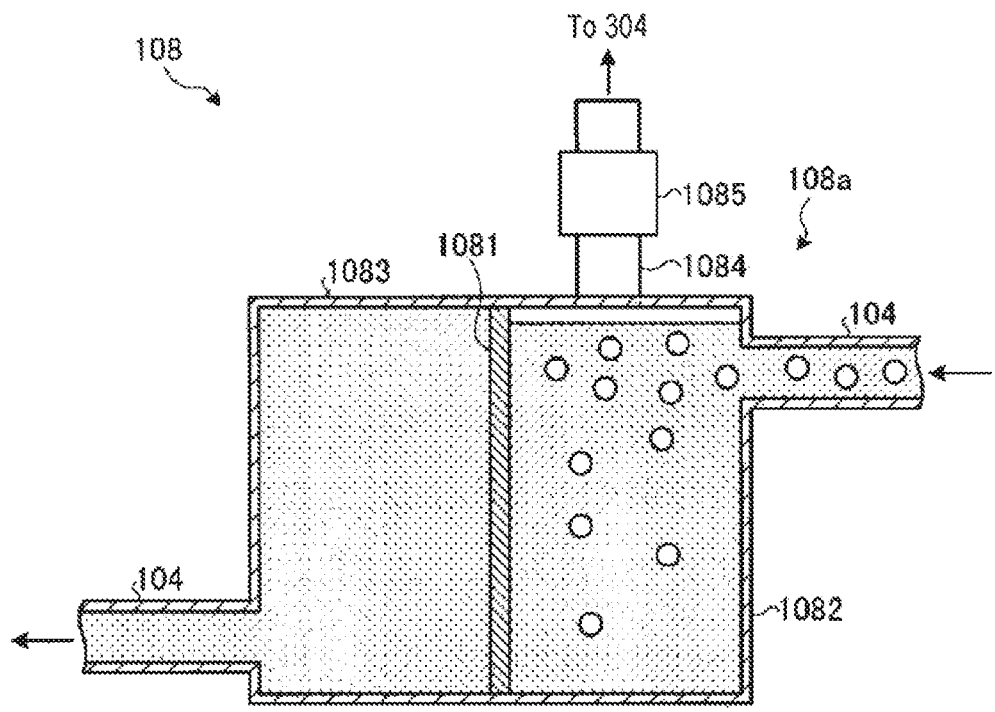
FIG. 6 is a view illustrating a configuration example of a filter part.

FIG. 6 is a view illustrating a configuration example of the filter part 108. The filter part 108 is composed of two filters 108a which are arranged in parallel with respect to the circulation path 104, as illustrated in FIG. 3.

In FIG. 6, a filtering member 1081, which is made of a synthetic resin or the like, captures contaminants such as particles contained in the processing liquid, while passing the processing liquid only. A first processing liquid chamber 1082 is a closed region provided on the primary side of the filter 108a and temporarily stores the processing liquid flowing in from the circulation path 104 on the side connected to the storage tank 102. A second processing liquid chamber 1083 is a closed region provided on the secondary side of the filter 108a, temporarily stores the processing liquid that has passed through the filtering member 1081, and flows the processing liquid out to the circulation path 104 again.

A vent pipe 1084 for allowing a gas to pass therethrough is provided on the upper surface of the first processing liquid chamber 1082. The vent pipe 1084 is provided with a throttle 1085 for adjusting the amount of gas passing, and the adjusted flow rate of the gas is discharged to a gas flow path 304 and is returned to the storage tank 102.

By measuring the pressure of the pump 106, the pressure loss due to the filtering member 1081, and the like in advance and adjusting the throttle amount of the throttle 1085 based on the relationship therebetween, the foams contained in the processing liquid in the first processing liquid chamber 1082 can be directed upward without passing through the filtering member 1081. The foams that have arrived at the top gather and are discharged from the vent pipe 1084. In this way, the filter part 108 functions, during the supply or circulation of the processing liquid, as a first foam removal part that mainly removes foams from the processing liquid stored in the storage tank 102 and outflows the processing liquid, from which the foams are removed, toward the heater 109.

In addition, in the first embodiment, by arranging the filters 108a in parallel with respect to the circulation path 104, a pressure acting on the filters 108a can be distributed as compared with a case where only one filter 108a is provided. In addition, the discard diameter of the vent pipe 1084 can be substantially widened. Thus, it is possible to efficiently remove the foams as a whole while suppressing a decrease in the flow rate of the processing liquid generated by the pump 106.

Figure 7:
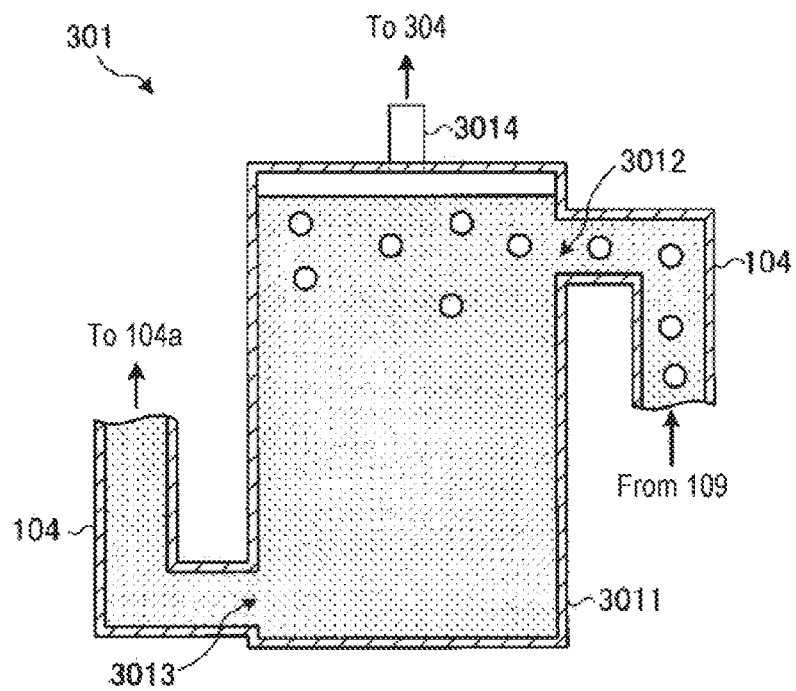
FIG. 7 is a view illustrating a configuration example of a defoamer.

FIG. 7 is a view illustrating a configuration example of the defoamer 301. Although the processing liquid contains no foam immediately after passing through the filter part 108, since the hydrogen peroxide solution remains in the processing liquid, the sulfuric acid and the hydrogen peroxide solution react to generate foams. Further, the heater 109 raises the temperature of the processing liquid and promotes the foaming. The defoamer 301 removes such foams of the processing liquid.

As illustrated in FIG. 7, the defoamer 301 is composed of a defoaming chamber 3011, an upper inlet 3012 connected to the circulation path 104 on the heater 109 side, a lower outlet 3013 connected to the circulation path 104 on the first pipeline 104a side, and a gas discharge port 3014.

The processing liquid that flowed into the defoaming chamber 3011 via the upper inlet 3012 is temporarily stored in the defoaming chamber 3011. The stored processing liquid flows out to the circulation path 104 via the lower outlet 3013.

Here, the defoaming chamber 3011 has a cylindrical shape, and has a sectional area larger than that of the circulation path 104. Accordingly, the processing liquid that flowed into the defoaming chamber 3011 has a relatively reduced flow velocity and moves downward as a whirling flow. Here, the foams present in the processing liquid move upward against the traveling direction of the processing liquid, and gather at the upper portion of the defoaming chamber 3011. The gathered foams are discharged as a gas to the gas flow path 304 through the gas discharge port 3014. In this manner, the defoamer 301 functions, during the supply or circulation of the processing liquid, as a second foam removal part that removes the foams from the processing liquid heated by the heater 109 and outflows the processing liquid, from which the foams are removed, toward the first pipeline 104a.

Figure 8:
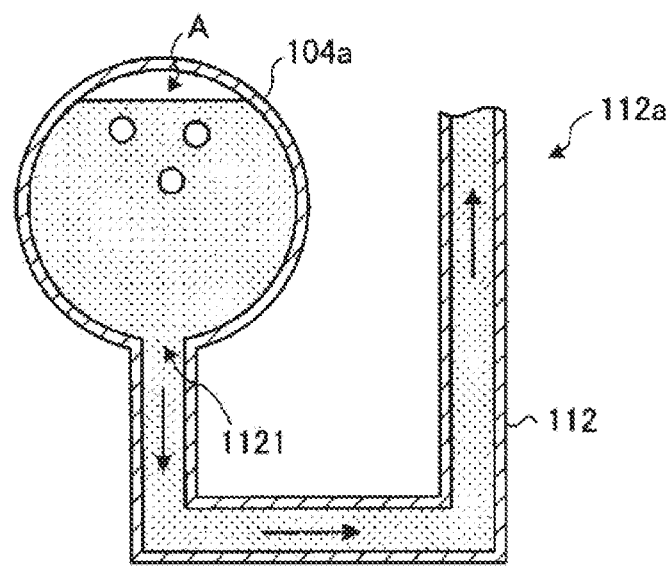
FIG. 8 is a view illustrating a configuration example of a branching part.

FIG. 8 is a view illustrating a configuration example of the branching part 112a. As illustrated in FIG. 8, the branching part 112a has an opening 121 through which the processing liquid flows out from the first pipeline 104a to the branch path 112. In the branching part 112a, the opening 1121 is formed below the periphery of the first pipeline 104a when the first pipeline 104a is viewed in section. The opening 1121 has the same sectional area as that of the branch path 112.

Since the first pipeline 104a extends in the horizontal direction, as the processing liquid passes through the first pipeline 104a, the foams move upward in the pipeline and gather at the upper portion of the pipeline to form a gas region A. On the other hand, the foams do not move downward and do not enter the opening 1121 in the branching part 112a. In this way, the branching part 112a functions, during the supply or circulation of the processing liquid, as a third foam removal part that removes relatively small foams from the processing liquid passing through the first pipeline 104a and outflows the processing liquid, from which the foams are removed, toward the branch path 112.

Figure 9:
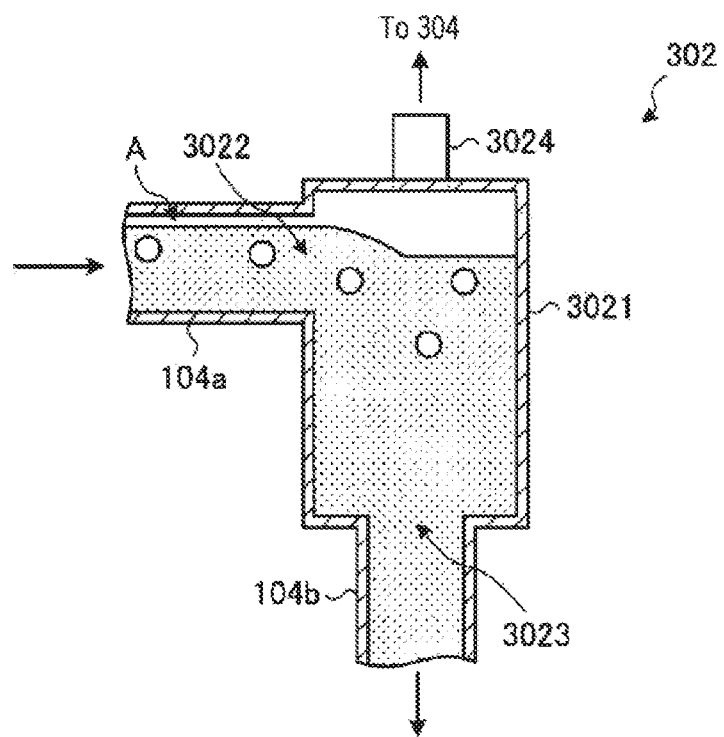
FIG. 9 is a view illustrating a configuration example of a gas discharger.

FIG. 9 is a view illustrating a configuration example of the gas discharger 302. As illustrated in FIG. 9, the gas discharger 302 is placed at the boundary between the first pipeline 104a and the second pipeline 104b. The gas discharger 302 includes a gas collection chamber 3021, a processing liquid inlet 3022, a processing liquid outlet 3023, and a gas discharge port 3024. The gas discharge port 3024 is formed on the upper surface (ceiling) of the gas collection chamber 3021 such that a gas is discharged from the circulation path 104 to the outside.

As described above, the foams of the processing liquid flowing through the first pipeline 104a move upward, and the foams gather at the upper portion form the gas region A. The gas region A and the processing liquid containing some foams flow into the gas collection chamber 3021 via the processing liquid inlet 3022.

The gas that flowed into the gas collection chamber 3021 immediately gathers at the upper portion of the gas collection chamber 3021. The processing liquid that flowed into the gas collection chamber 3021 flows under the influence of gravity toward the processing liquid outlet 3023. In this course, the foams present in the processing liquid move upward of the gas collection chamber 3021 against the flow direction and gather in the upper portion of the gas collection chamber 3021.

The gas gathering in the upper portion of the gas collection chamber 3021 is discharged to the gas flow path 304 via the gas discharge port 3024. In this way, the gas discharger 302 functions, during the supply or circulation of the processing liquid, as a fourth foam removal part that removes the foams from the processing liquid that has passed through the first pipeline 104a and removes the gas, which has already been separated from the processing liquid, and outflows the processing liquid, from which the foams are removed, toward the second pipeline 104b.

As described above, the filter part 108 functions as the first foam removal part, the defoamer 301 functions as the second foam removal part, the branching part 112a functions as the third foam removal part, and the gas discharger 302 functions as the fourth foam removal part. With such a configuration, it is possible to achieve a superposed effect of removing foams by the plurality of foam removal parts during the circulation or supply of the processing liquid.

The arrangement of the foam removal parts also provides individual effects of the foam removal parts. First, there is an effect that foams are less likely to flow into the heater 109 due to the removal of foams by the filter part 108, and heating abnormalities are accordingly less likely to occur. In addition, there is an effect that it is possible to prevent foams generated by the heating operation of the heater from flowing into the branch path due to the removal of foams by the defoamer 301. In addition, since the branching part 112a is disposed near the flow meter 303, erroneous measurement of the flow meter 303 caused by relatively small foams does not occur. In addition, since the first pipeline 104a extends horizontally, there is an effect that foams and liquid can be separated from each other to some extent before flowing into the subsequent gas discharger 302 and the removal performance of the gas discharger 302 is improved. In addition, there is an effect that the foams of the processing liquid in the storage tank 102 can be reduced in advance prior to recirculation due to the removal of foams by the gas discharger 302.

As described above, according to the first embodiment, the processing liquid supplied to the processing unit does not contain foams. As a result, liquid scattering and mists caused by relatively large foams at the time of supply of the processing liquid to the wafer W are not generated, and a reduction in accuracy of recovery control due to erroneous measurement of the flow meter can be avoided, thereby achieving further high performance of wafer processing.

(Modifications)

Figure 10A:
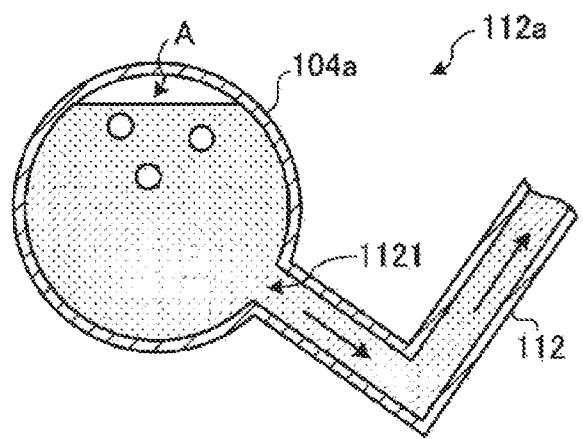
FIG. 10A is a view illustrating a modification of an opening formed in a first pipeline.
Figure 10B:
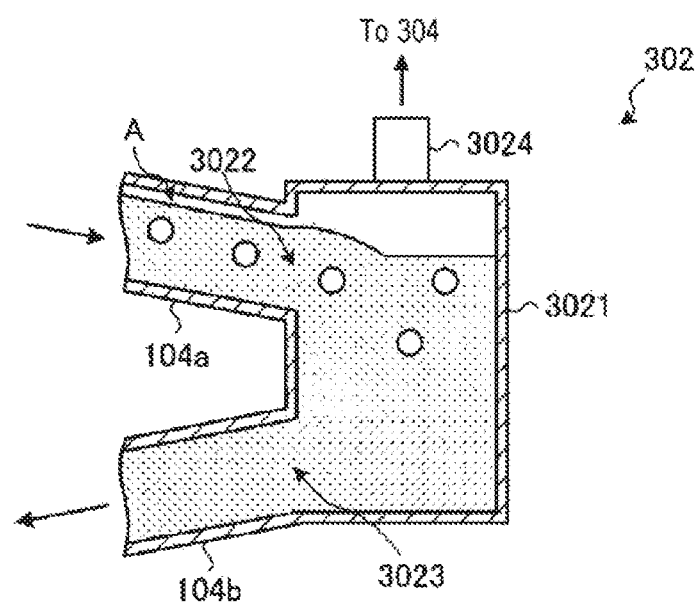
FIG. 10B is a view illustrating a modification of the first pipeline.

Next, modification of the first embodiment will be described with reference to FIGS. 10A and 10B. FIG. 10A is a view illustrating a modification of the opening 1121 formed in the first pipeline 104a. FIG. 10B is a view illustrating a modification of the first pipeline 104a.

In the first embodiment described above, the position of the opening 1121 formed in the first pipeline 104a is not limited to the directly-below position as illustrated in FIG. 8. For example, as illustrated in FIG. 10A, the position of the opening 1121 may be any lower position where relatively small foams do not enter, such as an oblique position.

Further, the first pipeline 104a is not limited to the horizontal direction as illustrated in FIG. 3, but may be inclined obliquely as long as the gas and the processing liquid can be separated from each other, as illustrated in FIG. 10B. Moreover, the second pipeline 104b connected to the gas discharger 302 may also be connected at an oblique position instead of a position directly below, and the second pipeline 104b itself may be inclined as long as the processing liquid can flow by the action of gravity.

Second Embodiment

Figure 11:
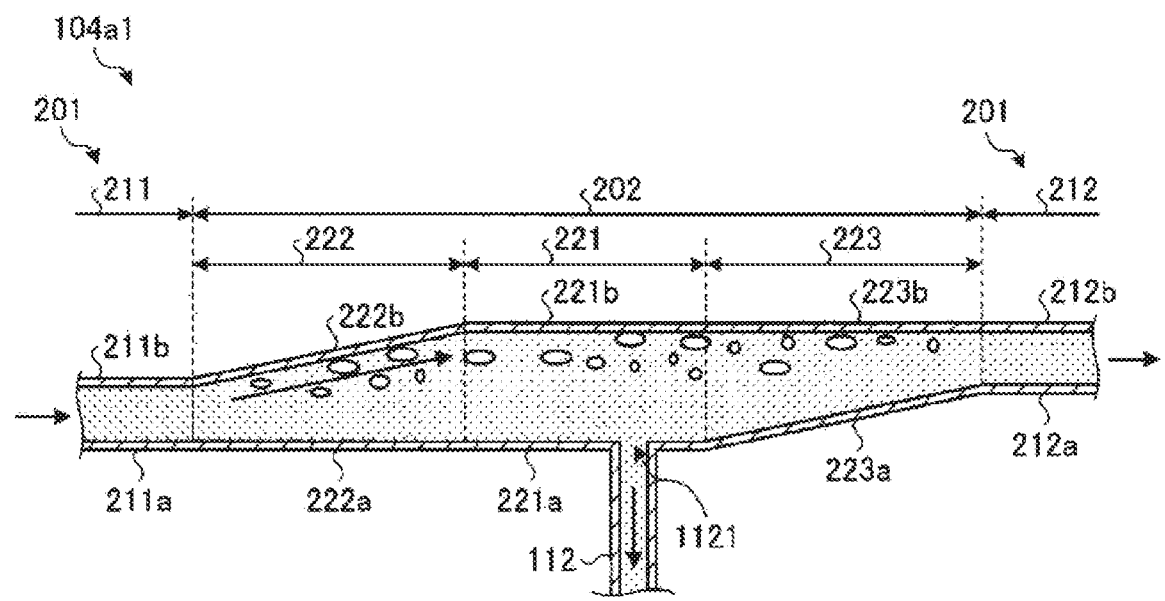
FIG. 11 is a view illustrating a configuration example of a first pipeline according to a second embodiment.

A second embodiment shows another configuration example of the first pipeline. FIG. 11 is a view illustrating a configuration example of the first pipeline according to the second embodiment.

As illustrated in FIG. 11, a first pipeline 104a1 includes a first portion 201 and a second portion 202. The first portion 201 is a portion having a first sectional area in the first pipeline 104a1. The second portion 202 is provided in the middle of the first portion 201 and has a second sectional area larger than the first sectional area. The sectional area as used herein refers to the area of a section obtained by cutting the first pipeline 104a1 along the radial direction. That is, the second portion 202 is a portion having a larger diameter than the first portion 201.

The opening 1121 of the branch path 112 is formed below the periphery of the second portion 202.

As described above, since the foams move in the upper portion of the first pipeline 104a1, as the diameter of the first pipeline 104a1 is increased, the foams will be located away from the opening 1121 formed below the periphery of the first pipeline 104a1 (the second portion 202). Therefore, by providing the second portion 202 in the first pipeline 104a1 and forming the opening 1121 below the periphery of the second portion 202, it is possible to suppress the foams from entering the opening 1121. That is, it is possible to remove the foams from the processing liquid passing through the first pipeline 104a1.

The first portion 201 includes an upstream first portion 211 provided in the upstream of the second portion 202 and a downstream first portion 212 provided in the downstream of the second portion 202. As illustrated in FIG. 11, the downstream first portion 212 is disposed at a position higher than the upstream first portion 211. In this way, by disposing the downstream first portion 212 at a position higher than the upstream first portion 211, it may be possible to suppress the foams from staying in the upper portion of the second portion 202.

The second portion 202 includes an intermediate portion 221, an upstream second portion 222, and a downstream second portion 223.

The intermediate portion 221 has a lower surface 221a having the same height position to the height position of a lower surface 211a of the upstream first portion 211, and an upper surface 221b having the same height position to the height position of an upper surface 212b of the downstream first portion 212. The intermediate portion 221 extends along the horizontal direction.

The upstream second portion 222 is provided between the upstream first portion 211 and the intermediate portion 221, and has an upper surface 222b inclined upward from an upper surface 211b of the upstream first portion 211 toward the upper surface 221b of the intermediate portion 221. A lower surface 222a of the upstream second portion 222 has the same height position to those of the lower surface 211a of the upstream first portion 211 and the lower surface 221a of the intermediate portion 221.

The downstream second portion 223 is provided between the intermediate portion 221 and the downstream first portion 212, and has a lower surface 223a inclined upward from the lower surface 221a of the intermediate portion 221 toward a lower surface 212a of the downstream first portion 212. An upper surface 223b of the downstream second portion 223 has the same height position to those of the upper surface 221b of the intermediate portion 221 and the upper surface 212b of the downstream first portion 212.

The opening 1121 of the branch path 112 is formed below the periphery of the intermediate portion 221.

As described above, the upstream second portion 222, which is a connection portion between the upstream first portion 211 and the intermediate portion 221, and the downstream second portion 223, which is a connection portion between the intermediate portion 221 and the downstream first portion 212, are tapered. Thus, the sectional area of the first pipeline 104a1 can be gradually changed between the first portion 201 and the second portion 202. Therefore, it may be possible to suppress turbulence in the flow of the processing liquid at the connection portion between the upstream first portion 211 and the intermediate portion 221 and at the connection portion between the intermediate portion 221 and the downstream first portion 212.

Further, by tapering the upstream second portion 222, which is the connection portion between the upstream first portion 211 and the intermediate portion 221, it is possible to suppress a so-called "flow separation" in which the flow of the processing liquid is interrupted when the processing liquid flows from the upstream first portion 211 into the second portion 202. When the flow separation occurs, foams may be generated at a separated portion. Therefore, by suppressing the flow separation, it is possible to suppress the foams from entering the opening 1121 of the branch path 112.

In addition, since the flow of foams heading obliquely upward is formed in the upstream second portion 222, the foams are less likely to move toward the opening 1121 formed below the periphery of the intermediate portion 221. This also can suppress the foams from entering the opening 1121 of the branch path 112.

Further, by disposing the lower surface 211a of the upstream first portion 211, the lower surface 222a of the upstream second portion 222, and the lower surface 221a of the intermediate portion 221 at the same height position, it is possible to suppress the flow of the processing liquid directing downward from being formed in the second portion 202. Therefore, it is possible to suppress the foams from being dragged by the flow of the processing liquid directing downward and approaching the opening 1121.

Further, by disposing the upper surface 221b of the intermediate portion 221, the upper surface 223b of the downstream second portion 223, and the upper surface 212b of the downstream first portion 212 at the same height position, it is possible to suppress the foams from staying in the upper portion of the second portion 202.

As described above, with the first pipeline 104a1 according to the second embodiment, by providing the second portion 202 having a larger sectional area than that of the first portion 201 and forming the opening 1121 below the periphery of the second portion 202, it is possible to suppress the foams from entering the opening 1121.

(Modifications)

Figure 12:
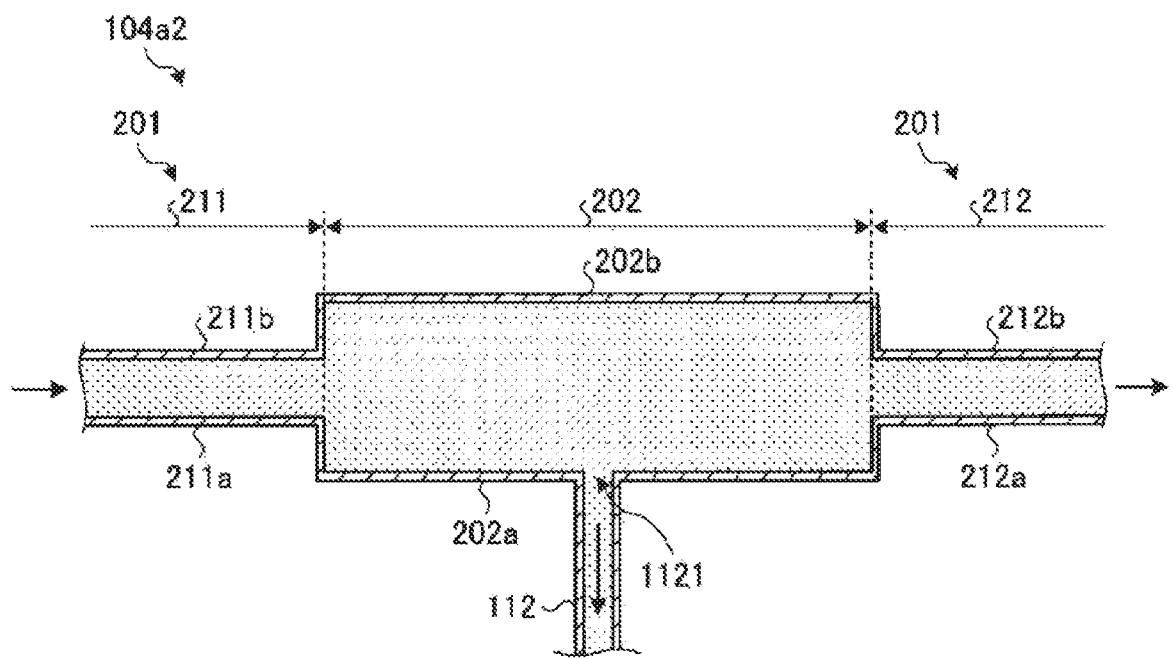
FIG. 12 is a view illustrating a configuration example of a first pipeline according to a first modification of the second embodiment.
Figure 13:
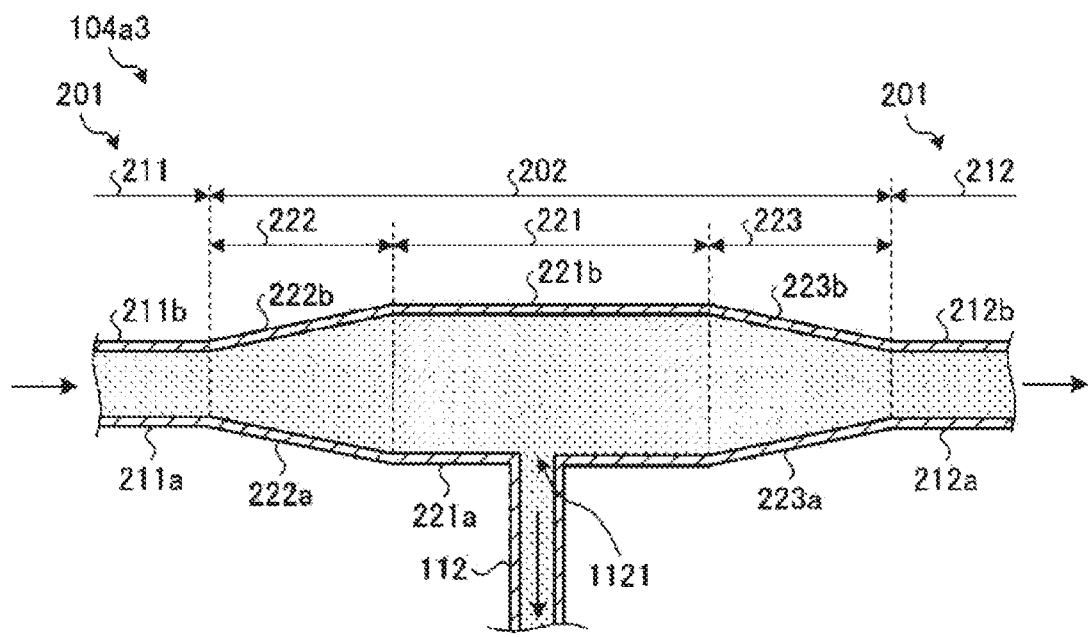
FIG. 13 is a view illustrating a configuration example of a first pipeline according to a second modification of the second embodiment.
Figure 14:
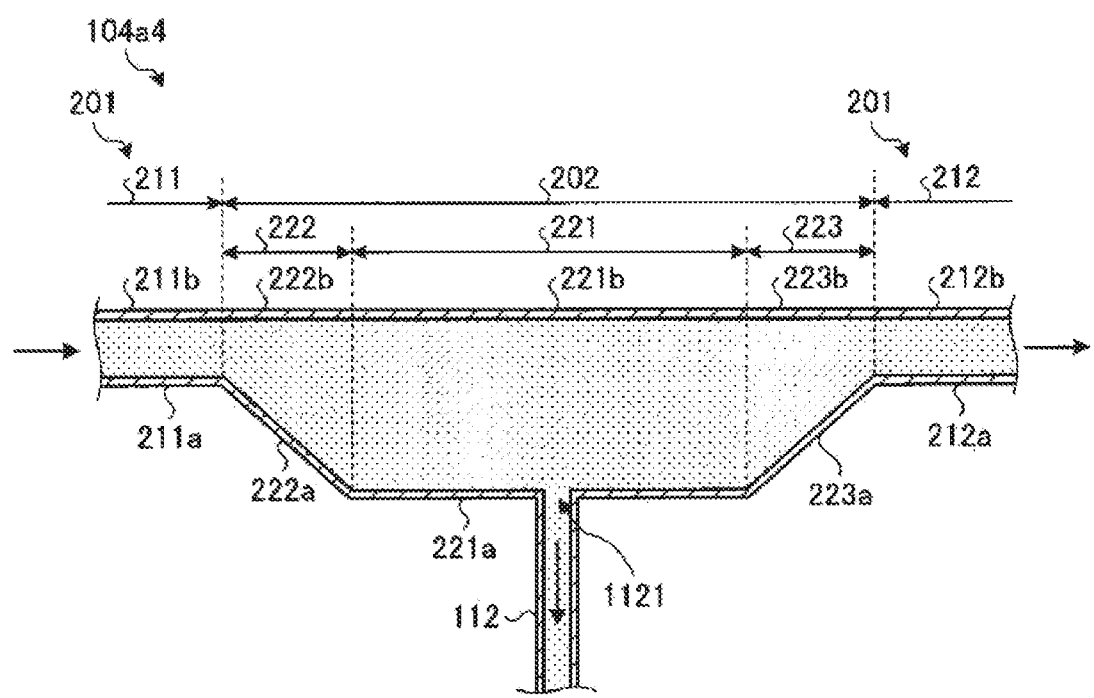
FIG. 14 is a view illustrating a configuration example of a first pipeline according to a third modification of the second embodiment.

The configurations of the first portion and the second portion are not limited to the examples described above. Modifications of the first pipeline in the second embodiment will be described below. FIGS. 12 to 14 are views illustrating configuration examples of the first pipeline according to first to third modifications of the second embodiment.

As illustrated in FIG. 12, in a first pipeline 104a2 according to the first modification, the upstream first portion 211 and the downstream first portion 212 are disposed at the same height position. The second portion 202 extends uniformly and horizontally from the end portion on the upstream first portion 211 side to the end portion on the downstream first portion 212 side.

A lower surface 202a of the second portion 202 is disposed at the height position lower than those of the lower surface 211a of the upstream first portion 211 and the lower surface 212a of the downstream first portion 212. In addition, an upper surface 202b of the second portion 202 is disposed at the height position higher than those of the upper surface 211b of the upstream first portion 211 and the upper surface 212b of the downstream first portion 212. The opening 1121 of the branch path 112 is formed below the periphery of the second portion 202.

As described above, by providing the second portion 202 having a larger sectional area than that of the first portion 201 in the first pipeline 104a2 and forming the opening 1121 below the periphery of the second portion 202, it is possible to suppress the foams from entering the opening 1121. That is, it is possible to remove the foams from the processing liquid passing through the first pipeline 104a2.

Further, as illustrated in FIG. 13, in a first pipeline 104a3 according to the second modification, like the first pipeline 104a2 according to the first modification, the upstream first portion 211 and the downstream first portion 212 are disposed at the same height position.

The second portion 202 includes the intermediate portion 221, the upstream second portion 222, and the downstream second portion 223. The lower surface 221a of the intermediate portion 221 is disposed at the height position lower than those of the lower surface 211a of the upstream first portion 211 and the lower surface 212a of the downstream first portion 212. Further, the upper surface 221b of the intermediate portion 221 is disposed at the height position higher than those of the upper surface 211b of the upstream first portion 211 and the upper surface 212b of the downstream first portion 212. The opening 1121 of the branch path 112 is formed below the periphery of the intermediate portion 221.

The upstream second portion 222 includes the lower surface 222a inclined downward from the lower surface 211a of the upstream first portion 211 toward the lower surface 221a of the intermediate portion 221, and the upper surface 222b inclined upward from the upper surface 211b of the upstream first portion 211 toward the upper surface 221b of the intermediate portion 221. The downstream second portion 223 includes the lower surface 223a inclined upward from the lower surface 221a of the intermediate portion 221 toward the lower surface 212a of the downstream first portion 212, and the upper surface 223b inclined downward from the upper surface 221b of the intermediate portion 221 toward the upper surface 212b of the downstream first portion 212.

As described above, by providing the second portion 202 having a larger sectional area than that the first portion 201 in the first pipeline 104a3 and forming the opening 1121 below the periphery of the second portion 202, it is possible to suppress the foams from entering the opening 1121. Further, the upstream second portion 222, which is a connection portion between the upstream first portion 211 and the intermediate portion 221, and the downstream second portion 223, which is a connection portion between the intermediate portion 221 and the downstream first portion 212, are tapered. Thus, the sectional area of the first pipeline 104a3 can be gradually changed between the first portion 201 and the second portion 202. Therefore, it is possible to suppress turbulence in the flow of the processing liquid, for example, at the connection portion between the upstream first portion 211 and the intermediate portion 221 and at the connection portion between the intermediate portion 221 and the downstream first portion 212.

Further, by tapering the upstream second portion 222 which is the connection portion between the upstream first portion 211 and the intermediate portion 221, it is possible to suppress a flow separation.

Further, as illustrated in FIG. 14, in a first pipeline 104a4 according to the third modification, the upstream first portion 211 and the downstream first portion 212 are disposed at the same height position.

The second portion 202 includes the intermediate portion 221, the upstream second portion 222, and the downstream second portion 223. The lower surface 221a of the intermediate portion 221 is disposed at the height positon lower than those of the lower surface 211a of the upstream first portion 211 and the lower surface 212a of the downstream first portion 212. Further, the upper surface 221b of the intermediate portion 221 is disposed at the same height position to those of the upper surface 211b of the upstream first portion 211 and the upper surface 212b of the downstream first portion 212. The opening 1121 of the branch path 112 is formed below the periphery of the intermediate portion 221.

The upstream second portion 222 includes the lower surface 222a inclined downward from the lower surface 211a of the upstream first portion 211 toward the lower surface 221a of the intermediate portion 221. The downstream second portion 223 includes the lower surface 223a inclined upward from the lower surface 221a of the intermediate portion 221 toward the lower surface 212a of the downstream first portion 212. The upper surface 222b of the upstream second portion 222 and the upper surface 223b of the downstream second portion 223 are disposed at the same height position to those of the upper surface 211b of the upstream first portion 211, the upper surface 221b of the intermediate portion 221, and the upper surface 212b of the downstream first portion 212.

As described above, by providing the second portion 202 having a larger sectional area than that of the first portion 201 in the first pipeline 104a4 and forming the opening 1121 below the periphery of the second portion 202, it is possible to suppress the foams from entering the opening 1121. Further, the upstream second portion 222, which is a connection portion between the upstream first portion 211 and the intermediate portion 221, and the downstream second portion 223, which is a connection portion between the intermediate portion 221 and the downstream first portion 212, are tapered. Thus, the sectional area of the first pipeline 104a4 can be gradually changed between the first portion 201 and the second portion 202. Therefore, it is possible to suppress turbulence in the flow of the processing liquid, for example, at the connection portion between the upstream first portion 211 and the intermediate portion 221 and at the connection portion between the intermediate portion 221 and the downstream first portion 212. Further, the upper surface 211b of the upstream first portion 211, the upper surface 222b of the upstream second portion 222, the upper surface 221b of the intermediate portion 221, the upper surface 223b of the downstream second portion 223, and the upper surface 212b of the downstream first portion 212 are disposed at the same height position. Therefore, it is possible to suppress the foams from staying in the first pipeline 104a4.

Each of the first pipelines 104a1 to 104a4 has a plurality of second portions 202 corresponding to a plurality of branching parts 112a. In addition, an upstream first portion 211 provided in the upstream of one second portion 202 corresponds to a downstream first portion 212 provided in the downstream of another second portion 202 provided in the upstream of the one second portion 202. Similarly, a downstream first portion 212 provided in the downstream of one second portion 202 corresponds to an upstream first portion 211 provided in the upstream of another second portion 202 provided in the downstream of the one second portion 202. The upstream first portion 211 provided in the upstream of the second portion 202 provided in the most upstream side among the plurality of second portions 202 is connected to the defoamer 301 via a pipeline, which is provided in the upstream of each of the first pipelines 104al to 104a4 in the circulation path 104 and through which the processing liquid passes downward. Further, the downstream first portion 212 provided in the downstream of the second portion 202 provided in the most downstream side among the plurality of second portions 202 is connected to the gas discharger 302.

The modifications of the first embodiment can be also applied to the second embodiment. In other words, in the second embodiment, the position of the opening 1121 formed in each of the first pipelines 104al to 104a4 is not limited to the directly-below position, but may be any lower position where relatively small foams do not enter, such as an oblique position. Further, the first pipelines 104al to 104a4 are not limited to the horizontal direction, but may be inclined obliquely as long as the gas and the processing liquid can be separated from each other.

Further effects and modifications can be easily derived by those skilled in the art. Thus, the broader aspects of the present disclosure are not limited to the specific details and representative embodiments shown and described above. Accordingly, various modifications can be made without departing from the spirit or scope of the general inventive concepts as defined by the appended claims and equivalents thereof.

EXPLANATION OF REFERENCE NUMERALS

104: circulation path, 112: branch path, 112a: branching part, 108: filter part, 301: defoamer, 302: gas discharger

What is claimed is:

1. A liquid supply device for supplying a processing liquid to a substrate processing apparatus, the liquid supply device comprising:
    a storage configured to store the processing liquid including a first processing liquid and a second processing liquid;
    a circulation path having a first pipeline through which the processing liquid passes in a horizontal direction, and configured to circulate the processing liquid stored in the storage; and
    a branch path having a branching part and a flow meter, and configured to supply the processing liquid from the circulation path to the substrate processing apparatus, wherein:
    the branching part is connected to the first pipeline of the circulation path, and has an opening for allowing the processing liquid to flow out from the first pipeline of the circulation path to the branch path and a third pipeline,
    the third pipeline extends downward from the opening, u-turns upward, and then extends towards the flow meter, and
    the opening is formed in the branching part where the branching part meets the first pipeline and is provided at a portion in a downward direction of a periphery of the first pipeline when the first pipeline is viewed in a cross-section.

2. The liquid supply device of claim 1, wherein the circulation path further comprises a second pipeline, which is provided in the downstream of the first pipeline and through which the processing liquid passes downward,
    wherein the liquid supply device further comprises a gas discharger disposed at a boundary between the first pipeline and the second pipeline,
    wherein the processing liquid passes downward from the horizontal direction through the gas discharger, and
    wherein the gas discharger comprising:
        a gas collection chamber that collects a gas flowing into the gas collection chamber from the first pipeline; and a gas discharge port that discharges the gas collected in the gas collection chamber to the outside of the circulation path.

3. The liquid supply device of claim 1 further comprising a filter disposed at an upper stream of the circulation path ahead of the first pipeline,
wherein the filter includes:
a filtering member that removes unnecessary substances from the processing liquid and divides the filter into two chambers;
the two chambers including a first chamber receiving the processing liquid flowing in the circulation path; and
a vent pipe configured to enable a gas to be discharged from the first chamber.

4. The liquid supply device of claim 3, wherein the filter comprises a plurality of filters arranged in parallel in the circulation path.

5. The liquid supply device of claim 3 further comprising a defoamer interposed between the filter and the first pipeline in the circulation path.

6. The liquid supply device of claim 5 further comprising a heater configured to heat the processing liquid,
wherein the filter, the heater, and the defoamer are arranged in this particular order from an upstream in the circulation path.

7. The liquid supply device of claim 1, wherein the flow meter is configured to measure a flow rate of the processing liquid flowing through the branch path.

8. The liquid supply device of claim 1 further comprising a recovery path configured to recover the processing liquid supplied to the substrate processing apparatus and return the recovered processing liquid to the storage.

9. The liquid supply device of claim 1, wherein the first pipeline comprises:
a first portion having a first sectional area; and
a second portion provided in the middle of the first portion and having a second sectional area larger than the first sectional area,
wherein the opening is formed below a periphery of the second portion.

10. The liquid supply device of claim 2 further comprising a filter disposed at an upper stream of the circulation path ahead of the first pipeline,
wherein the filter includes:
a filtering member that removes unnecessary substances from the processing liquid and divides the filter into two chambers;
the two chambers including a first chamber receiving the processing liquid flowing in the circulation path; and
a vent pipe configured to enable a gas to be discharged the first chamber.

11. The liquid supply device of claim 4 further comprising a defoamer interposed between the filter and the first pipeline in the circulation path.

12. The liquid supply device of claim 2, wherein the flow meter is configured to measure a flow rate of the processing liquid flowing through the branch path.

13. The liquid supply device of claim 3, wherein the flow meter is configured to measure a flow rate of the processing liquid flowing through the branch path.

14. The liquid supply device of claim 2 further comprising a recovery path configured to recover the processing liquid supplied to the substrate processing apparatus and return the recovered processing liquid to the storage.

15. The liquid supply device of claim 3 further comprising a recovery path configured to recover the processing liquid supplied to the substrate processing apparatus and return the recovered processing liquid to the storage.

16. The liquid supply device of claim 2, wherein the first pipeline comprises:
a first portion having a first sectional area; and
a second portion provided in the middle of the first portion and having a second sectional area larger than the first sectional area,
wherein the opening is formed below a periphery of the second portion.

17. The liquid supply device of claim 3, wherein the first pipeline comprises:
a first portion having a first sectional area; and
a second portion provided in the middle of the first portion and having a second sectional area larger than the first sectional area,
wherein the opening is formed below a periphery of the second portion.

* * * * *